United States Patent [19]

Frank

[11] 4,143,272
[45] Mar. 6, 1979

[54] POWER SUPPLY FOR ELECTRON BEAM GUNS

[75] Inventor: Fritz Frank, Rodenbach, Fed. Rep. of Germany

[73] Assignee: Leybold-Heraeus GmbH & Co. KG, Cologne, Fed. Rep. of Germany

[21] Appl. No.: 857,966

[22] Filed: Dec. 6, 1977

[30] Foreign Application Priority Data

Dec. 11, 1976 [DE] Fed. Rep. of Germany ....... 2656314

[51] Int. Cl.$^2$ .......................................... H01J 27/00
[52] U.S. Cl. ................................... 250/425; 250/427
[58] Field of Search .................. 250/427, 425, 423 R, 250/306, 310, 396 R; 336/174, 175; 363/26; 315/177, 276; 219/121 EB, 121 EM

[56] References Cited

U.S. PATENT DOCUMENTS

| 3,789,288 | 1/1974 | Assow et al. | 363/26 |
| 3,921,113 | 11/1975 | Schiemann | 336/174 |
| 3,959,761 | 5/1976 | Graul | 336/174 |

*Primary Examiner*—Bruce C. Anderson
*Attorney, Agent, or Firm*—Sprung, Felfe, Horn, Lynch & Kramer

[57] ABSTRACT

A power supply for the cathode of an electron beam gun disposed in a vacuum chamber comprises a transformer for frequencies above about 20 kHz and having a primary winding and a secondary winding connected to the cathode. The transformer is mounted so as to integrate same into the vacuum chamber to dispose the primary winding in communication with the atmosphere and the secondary winding in communication with the vacuum chamber. A partition is disposed between the primary winding and the secondary winding to seal the primary winding from the vacuum and the seondary winding from the atmosphere. A control circuit recepive of a direct current supply has the output thereof connected to the primary winding of the transformer and has pulse width controlled transistors for the chopping of the direct current at a frequency above about 20 kHz.

4 Claims, 1 Drawing Figure

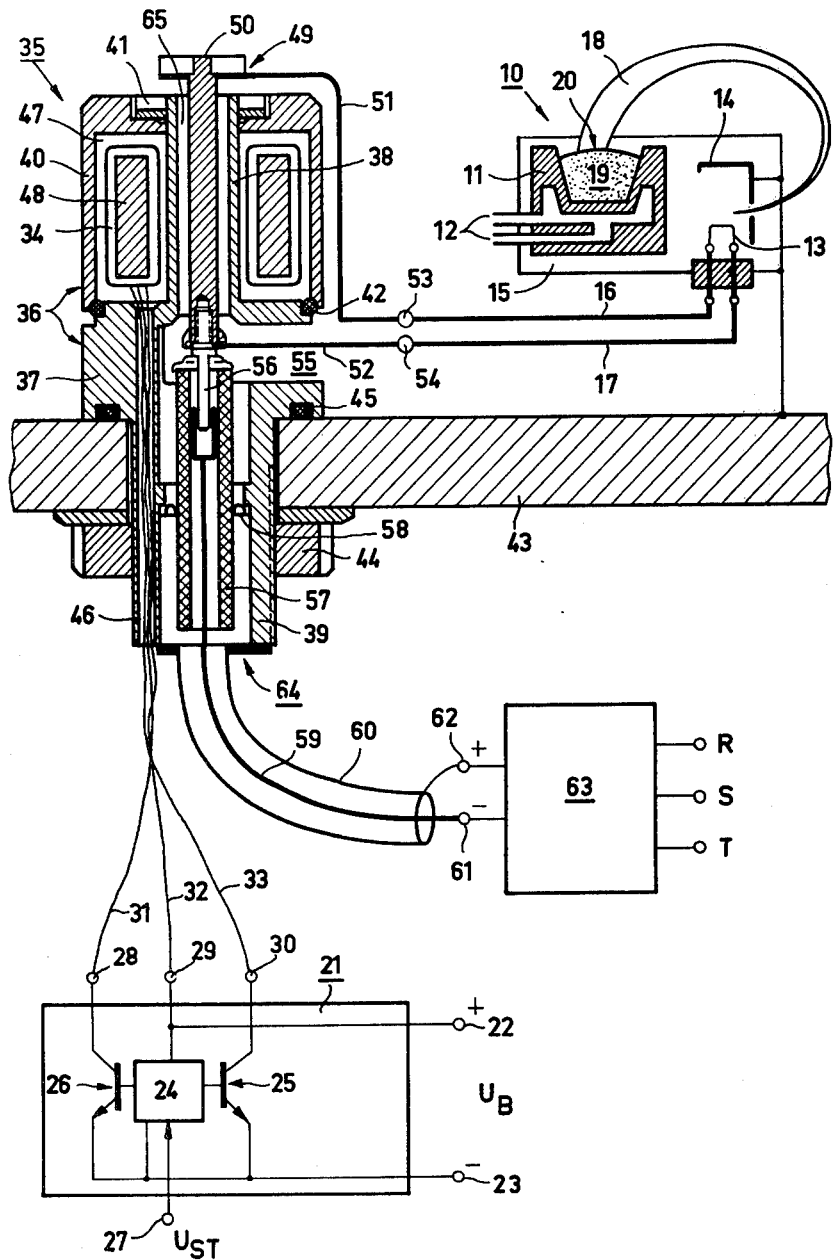

POWER SUPPLY FOR ELECTRON BEAM GUNS

BACKGROUND OF THE INVENTION

The invention relates to a power supply for cathodes of electron beam guns disposed in vacuum chambers, especially those of vapor depositing guns, and provided with magnetic beam deflection or focussing, consisting of a transformer having a primary winding and a secondary winding, leads introduced into the vacuum chamber, and phase shift controlled electrical operating circuits for control of the heating current.

In electron beam guns whose cathodes must fundamentally be disposed in a vacuum, it is important on the one hand to keep the beam current, the accelerating voltage and the magnetic force acting on the beam for the purpose of deflection and/or focussing as constant as possible, but on the other hand it is also important to adapt these magnitudes very rapidly to changing operating conditions. For example, the accelerating voltage and the magnet field strength are in an inverse relationship to one another with regard to the path of the beam and hence with regard to the point of impingement of the beam. Any change in the magnetic field which results in a field change or even a field distortion will change the position of the point of impingement. For reasons of the life expectancy of the cathode, among other things, the cathode is supplied with a low heater voltage of a few volts at a high current. The heating power determines the temperature and hence the emission current of the cathode at a given acceleration voltage. Added to the high heater current is the necessity of keeping the cathode at the high accelerating voltage potential. This leads to special insulation problems.

In the case of vapor depositing guns, furthermore, the rate of vaporization of the material being vaporized depends to a great extent on a constant beam management. Thus, for example, the rate of vaporization can be reduced by as much as 20% by instabilities in the deflection system, which can be produced, for example, by magnetic field superimpositions, on account of the high heating current at the main frequency without any change in the beam power itself. This is probably to be attributed to a persistent change in the point of impingement of the beam. In the case of power supplies for vapor depositing guns, it can also happen that the insulating value of insulators can be impaired by the condensation of conductive vapors, e.g., in the case of the vaporization of metals, so that flashovers can occur. On account of the danger of flashover it is also impractical to install transformers in the vacuum.

The state of the art includes a power supply such as described in the beginning, in which the transformer is constructed as a main frequency transformer, is disposed outside of the vacuum chamber, and is connected to the cathode by coaxial cables through high-voltage and high-current lead-throughs. For a heating voltage of 7 volts and a heating current between 25 and 100 amperes, the secondary voltage of the transformer must be, for example, 14 volts, since about half of the heating power is lost due to ohmic resistance in the lines from the transformer to the cathode, and this despite large cross sections in the lines. The line losses alone necessitate a doubling of the parameters of the transformer design. In addition, the transformer has to be constructed with high-voltage insulation, since the secondary side, which is connected to a high voltage (acceleration voltage), has to be reliably insulated from the primary side which is at the main potential. The high voltage on the secondary side is also the reason for the use of the coaxial cable, whose outer conductor is at ground potential for safety reasons.

In the known system, furthermore, the primary side of the transformer is controlled through phase shift controlled thyristors. This requires that the transformer be greatly oversized to prevent it from operating in the saturation range, in order to protect the thyristors. If it is desired to avoid such oversizing, circuitry for the protection of the thyristors must be provided, the cost of which is equal to that of an inverter. The over-design factor to be preferred for the protection of the thyristors, combined with the overdesign to be provided to compensate for the line losses, results in transformers which are approximately four times the size that would be required theoretically for the cathode heating.

In the known power supply system, there also exist stray inductances as well as capacitances due to the coaxial cables, which endanger the electronic controlling circuits upon the occurrence of the virtually inevitable gun short circuits, in which spike pulses can be produced which can amount to a multiple of the working voltage.

An attempt has therefore been made to rectify the heating current on the secondary side and to provide a choke coil and a filter circuit in the secondary circuit. Conditions can be slightly improved in this manner. Nevertheless, the point of impingement or focal point of the electron beam is affected by the heater current and the emission current, respectively. To aid in the understanding of this, it shall be explained that the lines carrying the high heater current inevitably have to run, depending on the gun design, in the more or less close vicinity of the magnetic deflection field. The magnetic fields surrounding the conductors are added to the magnetic deflection field, necessarily resulting in a displacement of the focal point. Such superimposition of magnetic fields is utilized in known electron guns for the purpose of intentionally deflecting the electron beam, with the use of additional means. The undesired influence of such fields, however, must be compensated in the known power supply system by modifying the deflection. Furthermore, rectification on the secondary side entails an additional lengthening of the conductors, which in turn again increases the losses.

Disclosure has been made of an attempt to reduce the line losses and hence the size of the transformer by locating the transformer directly underneath the vacuum chamber. The shortening of the conductors which is achieved in this manner does reduce the line losses accordingly, but the rest of the problems remain unsolved. In particular, high-voltage lead-throughs cannot be eliminated, and the power cutoff spikes are reduced only slightly.

SUMMARY OF THE INVENTION

The invention is addressed to the problem of designing a power supply for electron beam guns whereby power losses and thus the cost of production of the transformer will be considerably reduced, in which the beam will no longer be appreciably affected by the cathode heating current, in which the high voltage and current lead-throughs will no longer be needed, and in which the voltage spikes and cutoff peaks will be unable to occur to any appreciable extent.

The solution of the problem set forth above is accomplished in accordance with the invention, in the power supply system described in the beginning by the fact that:
 a. The transformer is integrated into the vacuum chamber, a partition wall being provided between the primary and secondary winding to separate the atmosphere from the vacuum, and the primary winding is in the atmosphere and the secondary winding is in the vacuum.
 b. The transformer is a medium frequency transformer for frequencies above about 20 kHz, and
 c. The transformer receives its input from a control system having pulse-width controlled transistors for the chopping of a direct current at a medium frequency.

The providing of the vacuum partition wall between the transformer windings does not produce any insulation problems on the primary side, since the primary is in the atmosphere and is at a low potential. Only the secondary side is in a vacuum. As it will further be shown hereinafter, it is nevertheless possible, on the basis of the additional measures of the invention, to make the secondary winding a one-turn winding, making it in the form of a rigid structure which can be freely suspended, so that, with the exception of a supporting insulator, the insulation can be provided exclusively in the form of vacuum gaps.

The vacuum partition consists of nonmagnetic metal and at the same time acts as an electrostatic shielding of the primary side from the high voltage carrying secondary side. High current lead-throughs can be entirely dispensed with, since the high heating current is produced exclusively within the vacuum chamber. By designing the transformer as a medium frequency transformer for frequencies above about 20 kHz (i.e., above the threshold of hearing), it is possible to make the transformer a single-turn transformer, thereby establishing one of the essential requirements for providing the partition wall between the atmosphere and the vacuum. A transformer results which has a substantially smaller bulk, since the transformer volume tends to be approximately inversely proportional to the frequency. With the use of a medium frequency, the magnetic field otherwise produced by the heating current no longer penetrates into the range of the massive iron pole shoes, on account of the skin effect associated with the medium frequency. The focal point stands steady, i.e., neither oscillation nor any permanent displacement takes place.

The problem of preventing any overloading of the transistors by saturation of the transformer is solved by the use of a control system having pulse width controlled transistors. This can be accomplished simply, for example, by means of a fast-responding overload protection. The bulk of the transformer is further reduced by the possibility of making full use of the power of the transformer. Thus, again, it is possible not only to incorporate the transformer into the wall of the vacuum chamber, but also to arrange it in the immediate vicinity of the electron beam gun. If a plurality of guns are used in the same vacuum chamber, each gun can be associated with a transformer of its own, on account of the small size of the transformer, so that the change-over possibilities are substantially simplified.

Due to the extreme shortness of the conductors between the transformer and the electron beam gun, which can be achieved in this manner, one of the two formerly necessary high voltage cables is eliminated. Furthermore, the stray capacitance is reduced to less than 50%. The effective stray inductance of the high voltage circuit becomes negligibly small, because substantially less energy is released from the energy storing stray field of a smaller transformer. Furthermore, the single remaining high voltage cable can be used for a damping circuit, and only one high voltage lead-through is required, but one which, as stated further above, is not a high current lead-through.

The use of a control circuit having pulse width controlled transistors has the additional advantage of a linear regulating characteristic, i.e., a linear relationship between the cathode power and the control voltage, the control circuit being adjustable between 0 and 100%.

The transformer for the power supply of the invention is distinguished according to the further invention in that the windings of the transformer are disposed in a housing of nonmagnetic material which is installed in the vacuum chamber and consists of a hollow prolongation extending into the vacuum chamber and of a cap enveloping the prolongation in a vacuum-tight manner so as to form an annular chamber, that the primary winding has an iron core and is disposed in the annular chamber and communicates with the atmosphere through a passage, and that the secondary winding is disposed within the hollow prolongation, which communicates with the interior of the vacuum chamber.

By the method of construction described, a transformer housing composed of few parts is achieved, in which the electrical parts are easily accommodated, and which in turn can easily be inserted in a vacuum-tight manner into the wall of the vacuum chamber.

At the same time it is especially advantageous to construct the transformer housing in a substantially rotationally symmetrical manner and provide it with a flange from which the hollow prolongation extends coaxially on one side and to which the cap can be screwed with simultaneous sealing against it, and to provide it on the other side with a coaxially projecting tubular appendage in which a voltage lead-through with a lead-through insulator is disposed in a vacuum-tight manner, which simultaneously serves as a supporting insulator for the secondary winding which is connected to the voltage lead-through. By this measure, the suspension or fastening of the secondary winding in a structural unit with the transformer housing is simultaneously created. Additional insulators are basically unnecessary, so that the secondary winding is insulated from the transformer housing only by air gaps in the one case and by vacuum gaps in the other.

This measure is especially advantageous when the secondary winding consists essentially of a metal bolt coaxially disposed within the prolongation, which constitutes the coaxail extension of the voltage lead-through or of the lead-through insulator and is insulated from the housing by a cylindrical gap.

BRIEF DESCRIPTION OF THE DRAWING

An example of the embodiment of the invention will be further explained hereinafter with the aid of the FIGURE which shows a schematic diagram of the power supply, along with an axial cross section taken through the transformer, and a diagrammatic representation of an electron beam vaporizer.

DETAILED DESCRIPTION OF THE INVENTION

In the FIGURE, 10 designates an electron beam vaporizer consisting of a vaporizing crucible 11 having cooling water connections 12, a cathode 13 and an anode 14, and a deflection magnet system of which only one pole shoe plate 15 is shown. The cathode is supplied with heating current through lines 16 and 17 and at the same time is applied to a high voltage potential. During operation, an electron beam 18 is produced, which is deflected onto the illustrated curved path by the two pole shoe plates 15, of which the front one is omitted from the drawing, and impinges upon the vaporization material 19 in the crucible 11, at the point of impingement 20. Such electron beam vaporizers are the state of the art. Reference is made in this connection to German Pat. No. 22 06 995.

The heating current supply for the cathode 13 is provided by a power supply apparatus 21 which receives its working voltage $U_B$ through the terminals 22 and 23. A part of this control apparatus is a control circuit 24 for two pulse-width controlled transistors 25 and 26 which receive their control voltage $U_{ST}$ through the terminal 27. By means of the control circuit 24 it is possible to vary the pulse width of square wave pulses between 0 and 100% in a linear relationship to the control voltage $U_{ST}$. The power supply apparatus 21 has outputs 28, 29 and 30 to which a voltage of 100 volts in the form of square wave pulses is delivered, which is produced by the control circuit 24 at a frequency between 20 and 40 kHz. The outputs 28 and 30 are connected by lines 31 and 33 to the ends of a primary winding 34 of a transformer 35, while the output 29 is connected by the line 32 to a center tap of the primary winding 34.

The transformer 35 has a housing 36 of nonmagnetic material (VA steel) which consists of a flange 37 having a hollow prolongation 38 and a tubular appendage 39 as well as a cap 40. The cap 40 is fastened by a threaded ring 41 to the prolongation 38 and its outer rim rests upon the flange 37 and is insulated therefrom by an O-ring 42.

The tubular appendage 39 pierces a vacuum chamber 43, which here is formed by a container bottom. By means of a threaded ring 44, the flange 37 is clamped to the vacuum chamber 43 with the interposition of an O-ring 45. In the tubular appendage 39 there is a passage 46 through which the lines 31, 32 and 33 pass into an annular chamber 47 formed between the cap 40 and the prolongation 38. This annular chamber communicates with the atmosphere through the passage 46 and serves to accommodate the previously described primary winding 34, which is mounted in the form of a toroidal coil on an iron core 48. It can be seen that the annular chamber 47 is hermetically sealed off from the interior of the vacuum chamber 43.

The hollow prolongation 38 is penetrated by a secondary winding 49 which consists of a metal bolt 50 aligned coaxially with the prolongation, and of the connecting leads 51 and 52. As it can be seen, the secondary winding is a single-turn winding and is connected to the cathode 13 through terminals 53 and 54 and conductors 16 and 17. The access of the lead 52 to the lower end of the metal bolt 50 is made possible by a lateral opening 55 in the flange 37. As seen in the figure, a sufficient vacuum gap is provided on all sides between the metal bolt with and its connecting leads 51 and 52, and the adjacent metal parts. Between the metal bolt 50 and the prolongation 38 there is a cylindrical gap 65.

The secondary winding 49, especially its metal bolt 50, is supported by a threaded rod 56 in a lead-through insulator 57 which is disposed concentrically within the tubular appendage 39 with the interposition of a vacuum seal 58. In this manner the lead-through insulator 57 constitutes an insulating support for the metal bolt 50.

The bottom end of the threaded pipe 56 is connected by a plug terminal, which is not shown, to a high voltage conductor 59 which is surrounded by a coaxial shield 60. The high voltage conductor and the shield lead through terminals 61 and 62 to a high voltage generator 63 in which a voltage of approximately 10,000 kV is generated. This high voltage is shared by the above-described wiring of the cathode 13 and consitutes what is known as the acceleration voltage. The upper end of the shield 60 is electrically connected to the tubular appendage 39 and hence to the anode potential which is also applied to the vacuum chamber 43.

It can be seen that no vacuum-tight lead-throughs are required for the connectors 31, 32 and 33. In the case of the voltage lead-through 64, which consists of the threaded rod 56 and the lead-through insulator 57, it is not a high-current lead-through that is involved. The high heating current is instead formed in the secondary winding 49 within the vacuum chamber 43. The voltage lead-through 64 is exceedingly well protected in the interior of the transformer housing 36, and care will be taken, in the reduction to practice of the invention, to see to it that the opening 55 is located on the side facing away from the vaporizer 10. The hollow prolongation 38 between the primary winding 34 and the secondary winding 49 constitutes, in principle, the partition wall separating the atmosphere from the vacuum. In this manner the transformer becomes an integral component of the vacuum system, which, in conjunction with the rest of the electrical devices, results in the advantages described in the beginning.

What is claimed is:

1. A power supply for the cathode of an electron beam gun disposed in a vacuum chamber to irradiate a vaporizable material, comprising:
a transformer for frequencies above about 20 kHz and having a primary winding and a secondary winding connected to the cathode; means mounting the transformer to integrate same into the vacuum chamber to dispose the primary winding in communication with the atmosphere and the secondary winding in communication with the vacuum of the vacuum chamber and including a partition disposed between the primary winding and the secondary winding to seal the primary winding from the vacuum and the secondary winding from the atmosphere; and control means receptive of a direct current supply and connected to the primary winding of the transformer and having pulse width controlled transistors for the chopping of the direct current at a frequency above about 20 kHz.

2. The power supply according to claim 1, wherein the windings of the transformer are disposed in a housing of nonmagnetic material which is inserted into the vacuum chamber, the housing comprising a hollow prolongation directed into the vacuum chamber and a cap hermetically surrounding the prolongation to define an annular chamber and a passage thereto, wherein the primary winding comprises an iron core disposed in the annular chamber and communicating with the atmosphere through the passage, and the secondary winding is disposed within the hollow prolongation and communicates with the interior of the vacuum chamber.

3. The power supply according to claim 2, wherein the transformer housing is substantially rotationally symmetrical and has a flange from which the hollow prolongation extends coaxially on one side, to which the cap can be screwed with simultaneous sealing against the flange, and a tubular appendage projecting coaxially on the other side, and receptive of a voltage lead-through hermetically disposed therein and which has a lead-through insulator, wherein the insulator serves simultaneously as a supporting insulator for the secondary winding, which is connected to the voltage lead-through.

4. The power supply according to claim 3, wherein the secondary winding comprises a metal bolt coaxially disposed in the prolongation and which constitutes the coaxial extension of one of the voltage lead-through and the lead-through insulator by a cylindrical gap insulating the bolt from the housing.

* * * * *